United States Patent
Klein et al.

(10) Patent No.: US 6,756,826 B1
(45) Date of Patent: Jun. 29, 2004

(54) METHOD OF REDUCING THE PROPAGATION DELAY AND PROCESS AND TEMPERATURE EFFECTS ON A BUFFER

(75) Inventors: Christian Klein, Portland, ME (US); James J. McDonald, II, Gorham, ME (US)

(73) Assignee: Fairchild Semiconductor Corporation, South Portland, ME (US)

( * ) Notice: Subject to any disclaimer, the term of this patent is extended or adjusted under 35 U.S.C. 154(b) by 0 days.

(21) Appl. No.: 10/460,075

(22) Filed: Jun. 12, 2003

(51) Int. Cl.[7] .............................. H03B 1/00; H03K 3/00
(52) U.S. Cl. ....................... 327/112; 327/108; 327/170; 327/378
(58) Field of Search ......................... 327/108–112, 170, 327/138, 389, 391, 262, 309, 317, 362, 378, 512, 513; 326/32, 34, 23, 27, 83

(56) References Cited

U.S. PATENT DOCUMENTS 6,060,938 A * 5/2000 Morrill ........................ 327/391
6,373,296 B1 * 4/2002 Auer et al. .................. 327/108
6,437,622 B1   8/2002 Tinsley et al. .............. 327/513
6,535,020 B1 * 3/2003 Yin .............................. 326/83

* cited by examiner

*Primary Examiner*—Long Nguyen
(74) *Attorney, Agent, or Firm*—Cesari and McKenna, LLP; Edwin H. Paul, Esq.

(57) ABSTRACT

A buffer circuit with slow output edges is described. Pulsed higher value currents are driven from one shot timing circuits to inject a pulse of current into the control gate of the buffer's output MOSFET to speed up the beginning of the turning on or the turning off of the output MOSFT. When the beginning and turning on and off is reached lower value current sources continue to drive the gate of the output MOSFET. In one embodiment, one shots are triggered from the rising and falling edges of the input signal. The effect of the higher value current pulses is to reduce the circuit delay through the buffer. Also, the pulse width can be designed as temperature sensitive, and supply voltage sensitive so as to maintain the buffer circuit delay as substantially constant as temperature, supply voltage and process variation occur.

10 Claims, 5 Drawing Sheets

METHOD OF REDUCING THE PROPAGATION DELAY AND PROCESS AND TEMPERATURE EFFECTS ON A BUFFER

BACKGROUND OF THE INVENTION

1. Field of the Invention

The present invention relates to minimizing the effects of temperature and of manufacturing processing on the delay of a buffer while providing a fast buffer circuit propagation delay.

2. Background Information

Many electronic systems are built using backplane interconnections arrangement for sharing information and data among the various functions in particular systems. Since the systems and the backplane interconnections are arbitrarily dispersed and/or bussed to a number of different systems, the interconnection line impedance loading is uncontrolled. In such systems high speed edges may cause system errors. The uncontrolled termination impedance mismatches and line lengths of the interconnecting transmission lines result in extended ringing with high voltage swings that may interfere with logic functions. Moreover, the high speed edges will capacitively couple to other signal lines causing errors, and magnetic coupling among signal lines when currents abruptly change due to impedance anomalies also may cause logic errors. The troublesome fast edges necessitate use of slow edges that remain slow over operating conditions.

Backplanes are routinely used to interconnect high speed microprocessors system, mass memories, cache, communications systems, displays, keyboards, printers and other typical peripherals found in such systems. High speed edges cause problems in such systems.

Buffers driving backplanes are designed with slow slew rates to reduce the problems discussed just above. In addition, temperature compensated buffers are being designed, but such designs ignore the buffer circuit delay and the effects of power supply variations and process variations.

U.S. Pat. No. 6,437,622 illustrates the state of the known by providing for slow edges that are temperature compensated so that the slow edges change little with changes in temperature. The slow edges are achieved by "current starving" the gates of the output MOS transistors P1 and N1. By slowly driving the gates, the output edges are correspondingly slow. The inventive FIG. 1 taken from the U.S. Pat. No. 6,437,622 illustrates the to design. Here the current sources that slowly drive or starve the gates of transistors P1 and N1. In this design, the gate current adjusts with temperature to compensate for the slew rate changes of the drive transistors P1 and N1. More gate current is supplied at higher temperatures.

FIG. 2 illustrates the output of the buffer circuit as in FIG. 1. A difference in propagation delay of one nanosecond or more over process voltage and temperature is common with such designs. FIG. 2 shows the output waveform for 4 extreme PVT conditions including, corner (concurrent extremes of several parameters) process conditions, low and high VCCs and extreme temperatures. Trace 20 compared to trace 22 illustrates the variation due to a temperature change from +110 C. to −40 C. Trace 20 compared to trace 24 shows the variation from a "fast" to a "slow" process concurrent with a Vcc change from +3.45V to +3.15V. Trace 26 is a trace at +3.15V, −40 C. and with a slow process. The same parameter variations are shown in FIG. 4 with the inventive circuitry where the delay of one nanosecond in FIG. 2 is reduced to less than 0.1 nanoseconds 40.

The output transistors P1 and N1 of FIG. 1, exhibit thresholds that must be reached before the transistors respond. The low current necessarily will slowly drive the gates resulting in a circuit delay before the transistors begin to respond. In practical designs higher temperatures weaken the output drive MOS transistors, and, when combined power supply variations and chip making variations, nanoseconds of delay may be incurred.

But, in known designs, the delay of the buffer is excessive and uncontrolled with respect to temperature and variations in the manufacturing processes that naturally occur over time.

It is an objective of the present invention to minimize buffer delay and variation thereof with respect to changing operating conditions and manufacturing variations.

SUMMARY OF THE INVENTION

In view of the foregoing background discussion, the present invention provides a buffer circuit and a process for driving an output signal where an output drive transistor defines a control input, preferably a gate of a MOS transistor, that is driven in response to an input logic signal, slowly in the positive and the negative directions to thereby produce slow edges at the buffer's output. The present invention additionally provides pulses of current of both polarities that are triggered at the start of a positive and a negative logic transition. The pulse of current lasts only for enough time to overcome any thresholds that must be overcome before the buffer circuit output begins to react to the control input is signal. Preferably the pulses are provided by a one shot timing circuit triggered by the logic input signal. The timed output of the one shots activate switches to connect higher level current sources to the control input of the buffer circuit.

In a preferred embodiment, the one shot timing pulses can be designed with to compensate for temperature, process, and supply voltage variations such that the buffer circuit delay remains substantially constant over such variations. Typically, the one shot timing pulse will become longer with rising temperature, with slower transistor fabrication processes and with lower supply voltages.

Digital systems including computers or processing systems, communications, memories, and virtually any other digital system will find advantages implementing the present invention.

It will be appreciated by those skilled in the art that although the following Detailed Description will proceed with reference being made to illustrative embodiments, the drawings, and methods of use, the present invention is not intended to be limited to these embodiments and methods of use. Rather, the present invention is of broad scope and is intended to be defined as only set forth in the accompanying claims.

BRIEF DESCRIPTION OF THE DRAWINGS

The invention description below refers to the accompanying drawings, of which.

DETAILED DESCRIPTION OF AN ILLUSTRATIVE EMBODIMENT

Figure 1:
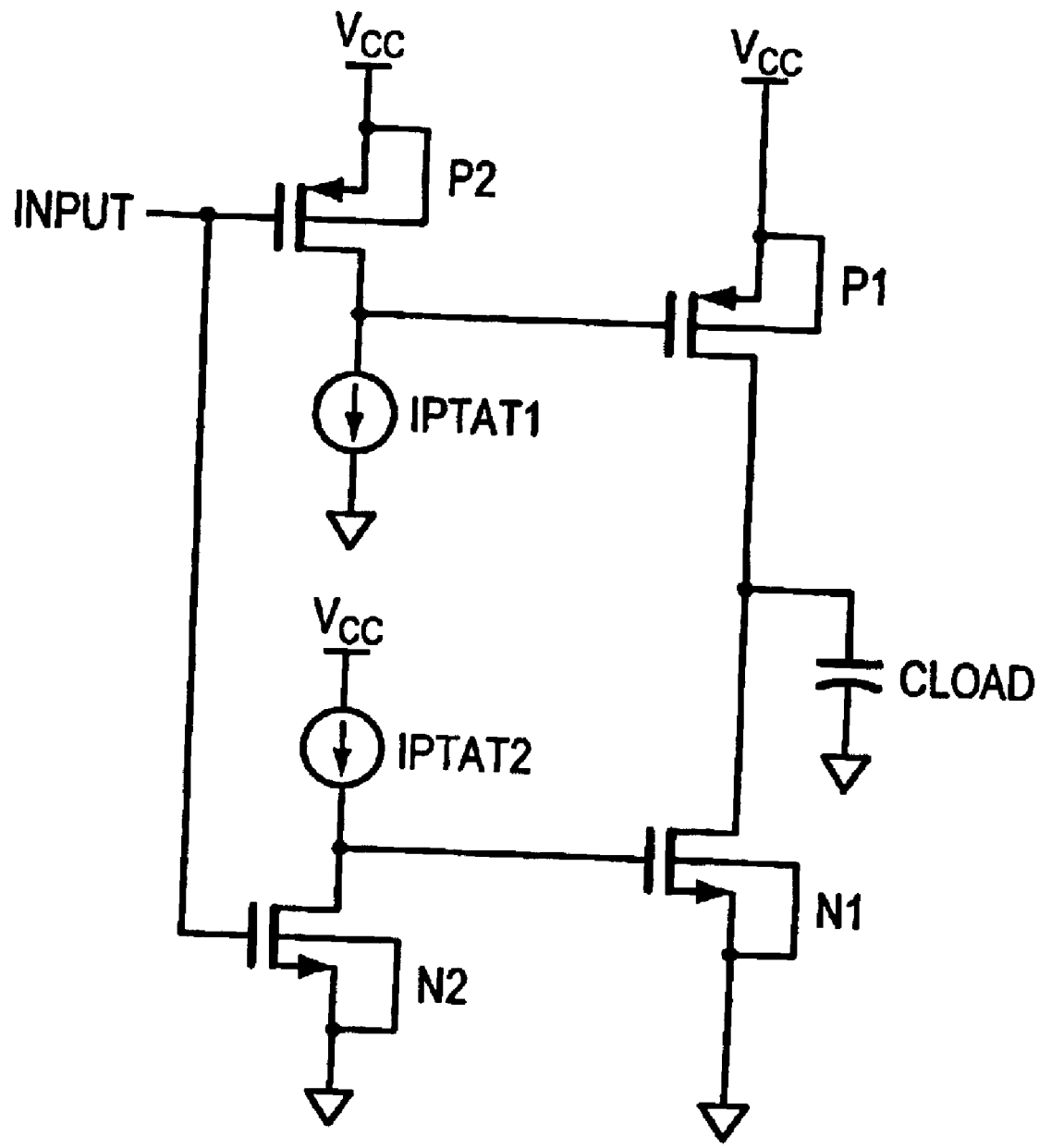
FIG. 1 is a schematic of prior art buffer circuits.
Figure 3:
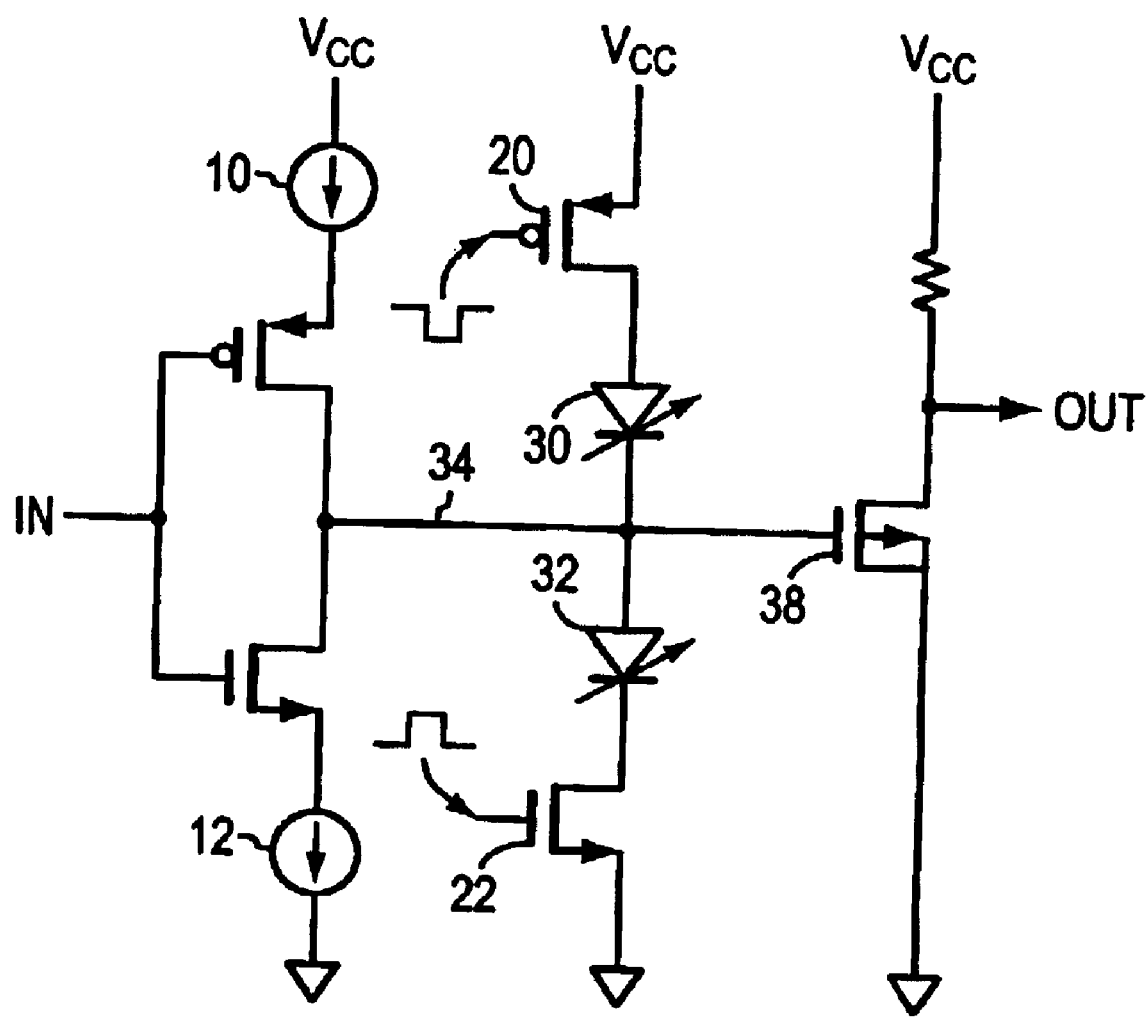
FIG. 3 is a schematic block diagram illustrating an embodiment of the present invention.

FIG. 3 is a schematic illustrating one embodiment of the present invention. The approach is to supply a short "tug" or pull on the gate of the output transistor in the same direction as the current sources of the prior art FIG. 1. The pull drives the gates quickly up to the output transistor thresholds to counter act the delay that would have occurred had only the low current been available to drive the gates. The pull will not affect the slow output edge if the pull is limited to only overcoming the thresholds, e.g. the first few hundred millivolts at the gates. After traversing these first several hundred millivolts of transition, the low current sources 10 and 12 continue to slowly drive the gate thereby producing the slow output edges desired. The edge transitions depend primarily on this finishing drive and so the slow edges are maintained. The pull starts the output moving well before it would have occurred without the present invention and so reduces the delay without affecting the edge transition rate.

Still referring to FIG. 3, the one shot pulses alternatively turn on transistors 20 and 22. The diodes 30 and 32 limit the voltage swing at the gate 34 of the output transistor 38 when transistors 20 and 22 are on. The voltage drops across the diodes can be size adjusted to match the threshold of the output transistor 38 so that the one shot drives will substantially overcome the threshold of the output transistor. Moreover, the design of the one shot pulse width can incorporate temperature compensation where as the temperature increases and the output transistor drive weaken, the pulse will increase providing a stronger initial pulse that counters the weakening transistors. Designs of one shots that provide increased pulse widths with temperature are well known in the art. Such designs may incorporate a timing capacitor that increases in value with temperature or a current source driving the capacitor may decrease with temperature. In either case or a combination the pulse width will be longer with increasing temperature.

Process variations slower process variation produce, typically, higher resistances and lower drive currents. Under such slower processes, one shot delay circuits will produce longer pulse widths that will act to compensate for the slower process effects on the other circuit components.

Figure 2:
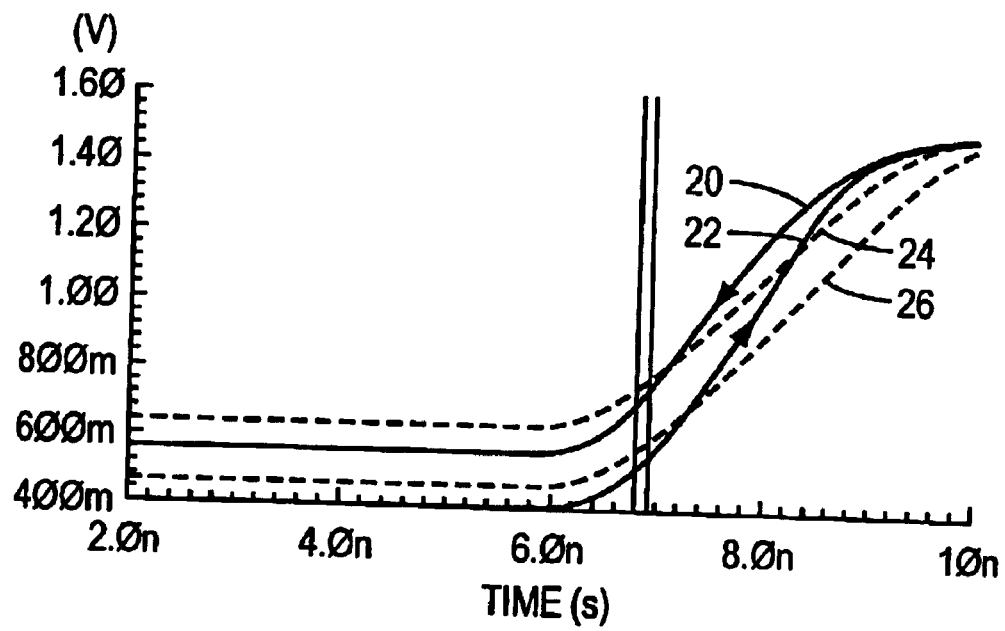
FIG. 2 is a timing chart showing delay variations of prior art buffer circuits.
Figure 4:
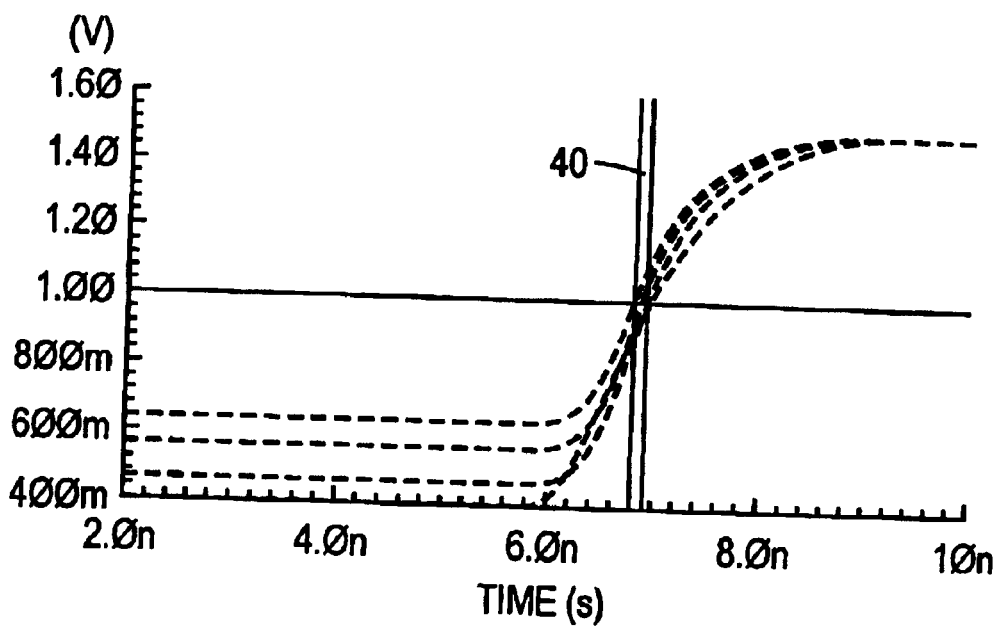
FIG. 4 is a timing diagram illustrating variations of the delay of the present invention over temperature, and process variations.

FIG. 4 illustrates, in comparison to the traces of FIG. 2, that the slow output edges are maintained, but that there is less than about 0.1 nanoseconds of delay 40 over variations in temperature, supply voltage and chip fabrication processes. The industrial temperature range of 40 to +85 degrees C. is used as the standard for judging temperature variations, and power supply variations of +/−5% from 3.3 V. Process variations are not easily standardized or quantified, but typically "slow" processes are emulated where threshold voltages are higher, current drives are lower and resistances are increased.

Figure 5:
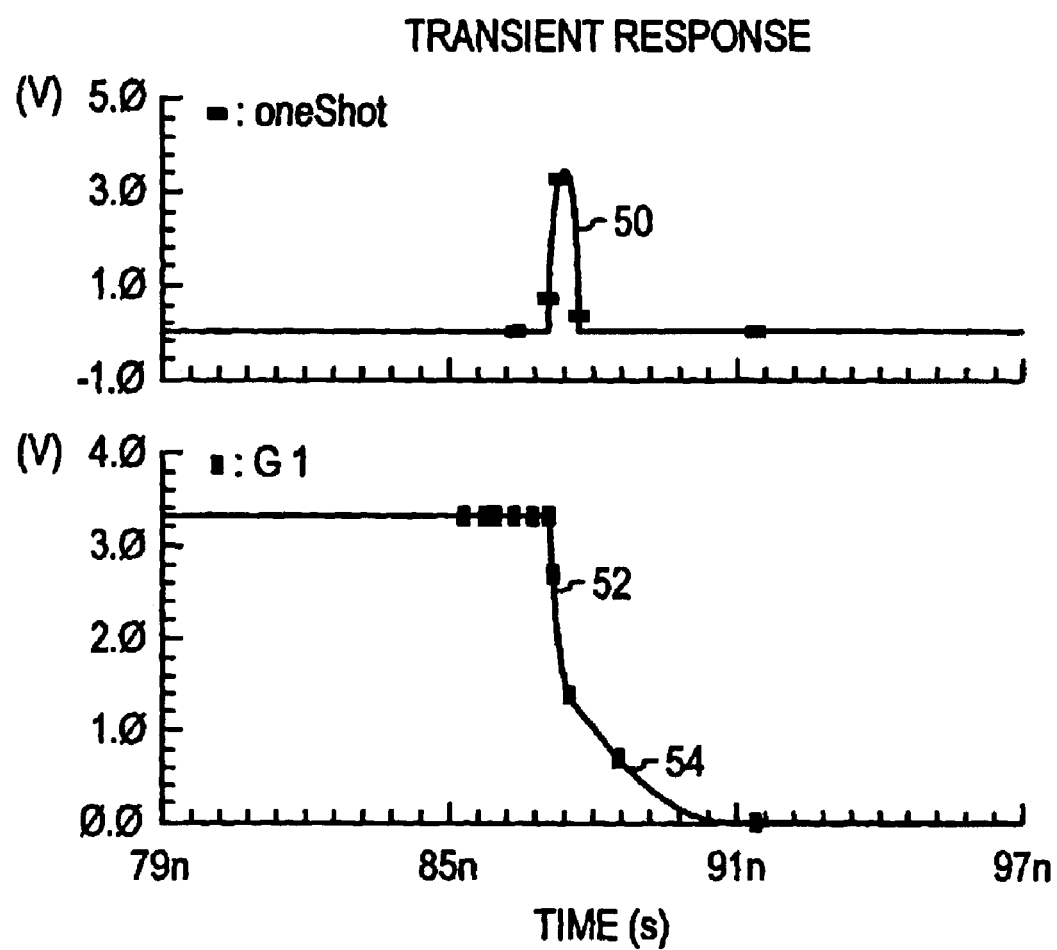
FIG. 5 is a timing chart of the one shot and the output transistor's gate voltage.

FIG. 5 shows the one shot timing pulse and a gate voltage. Here the gate voltage quickly decreases 52 during the pulse width 50 until the threshold of the output transistor is reached. Then the gate is driven only by the low current source the produces the slow gate 54 and the slow output edges.

Figure 6:
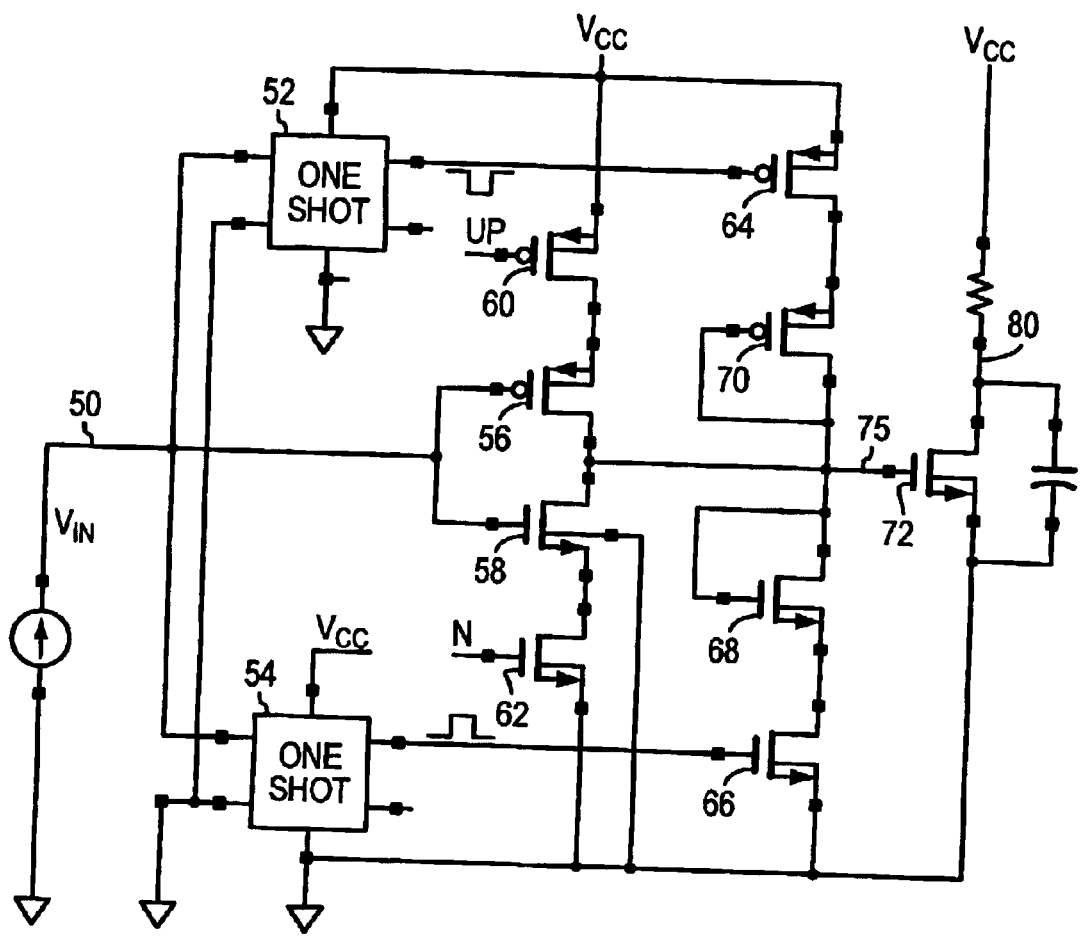
FIG. 6 is a more detailed schematic of FIG. 3.

FIG. 6 is a representative schematic of a preferred embodiment of the present invention. Here an input signal 50 drives, activates or triggers two one shots 52 and 54 that generate pulses on both the positive and the negative edges of the input signal. A negative edge on the input signal triggers a negative pulse from the one shot 52 turning PMOS 64 on. The PMOS 64 via the diode connected transistor 70 drives the gate 75 of the output transistor 72 high quickly. The diode connected PMOS 70 that is sized to provide a voltage drop consistent with the threshold of the output transistor 72. The input signal also drives a cascaded inverter set of MOS transistors 56 and 58. When the input signal goes low it turns on the PMOS 56 which connects the current source PMOS 60 to the gate 75. When the higher current pulse from transistor 64 is exhausted, the current from transistor 60 continues to drive the gate 75 high. Transistor 60 is configured to provide a low value current to slowly drive the gate 72 to provide the slow edge of the output signal 80.

When the input signal goes high, one shot 54 provides a positive pulse that turns on NMOS 66 that drives, via the voltage drop of the diode connected NMOS 68, the gate 75 low. When the pulse is exhausted the low level current provided by the current source of NMOS 62 continues to drive the gate 75 low via the on NMOS 58. This action produces a more slowly turning off of the output transistor 72 again to provide the slow edges at the output signal 80. In the specific circuit of FIG. 6, the rising output signal will also be dependent on the RC time constant of the resistor 82 and the capacitance C1 connected to the output 80.

Although the invention is described using MOS transistors, the same inventive approach can be used to advantage with bipolar transistors or with circuitry incorporating both MOS and bipolar circuitry. Those practiced in the art will be able to implement the present invention using these other processes.

The diode connected transistors, as mentioned above, can be sized to provide other voltage drops by those skilled in the art.

It should be understood that above-described embodiments are being presented herein as examples and that many variations and alternatives thereof are possible. Accordingly, the present invention should be viewed broadly as being defined only as set forth in the hereinafter appended claims.

What is claimed is:

1. A buffer circuit comprising:

an output drive transistor having a control input, first and second lower value current sources of opposite polarities, a first switch, when on, connects the first lower value current source to the control input, a second switch which, when on, connects the second lower value current source to the control input, first and second higher value pulsed current sources of opposite polarities, both of said pulsed current sources connected to the control input, where the first pulsed current source is of the same polarity as the first lower value current source, and the second pulsed current source is of the same polarity as the second lower value current source, an input signal having a first state where the first switch is turned on and a second state where the second switch is turned on, a timing circuit activated by edge transitions of the input signal, the timing circuit having outputs for activating both said higher value pulsed current sources, wherein the first switch and the first higher value pulsed current source are both turned on substantially simultaneously, and the second switch and the second higher value pulsed current source are both turned on substantially simultaneously.

2. The buffer circuit of claim 1 wherein the output transistor is a MOSFET and the control input is the MOSFET gate.

3. The buffer of claim 1 wherein the first higher value pulsed current source comprises: a third higher value current source, and
- a third switch that, when on, connects the third current source to the control input, and wherein the second higher value pulsed current source comprises: a fourth higher value current source, and
- a fourth switch that, when on, connects the fourth current source to the control input.

4. The buffer circuit of claim 3 wherein the timing circuit comprises a first one shot timing circuit that momentarily turns on the third switch and a second one shot timing circuit momentarily turns on the fourth switch.

5. The buffer circuit of claim 1 wherein the timing circuit is arranged for compensating for temperature, process and supply voltage variations, wherein the buffer circuit delay remains substantially constant over such variations.

6. A method comprising the steps of:
- providing an output transistor with a control input,
- connecting first and second lower value current sources, of opposite polarities, to the control input,
- connecting a first and second higher value pulsed current sources, of opposite polarities, to the control input, wherein the first higher value pulsed current source is of the same polarity as the first lower value current source, and the second higher value pulsed current source is of the same polarity as the second lower value current source,
- providing an input signal having a first state wherein the first switch is turned on and a second state where the second switch is turned on,
- activating a timing circuit by edge transitions of the input signal, and providing outputs from the timing circuit for triggering both said higher value pulsed current sources, wherein the connecting of the first lower value current source and the triggering of the first higher value pulsed current source occur substantially simultaneously, and the connecting of the second lower value current source and the triggering of the second higher value pulsed current source occur substantially simultaneously.

7. The method of claim 6 wherein the output transistor is a MOSFET, and the control input is the MOSFET gate.

8. The method of claim 6 wherein connecting said first higher value pulsed current source comprises the steps of:
- providing a third higher value current source,
- connecting the third current source to the control input via a third switch, and wherein the step of connecting said second higher value pulsed current source comprises the steps of:
- providing a fourth higher value current source, and connecting the fourth higher value current to the control input via a fourth switch.

9. The method of claim 8 further comprising the steps:
- momentarily turning on the third switch, and momentarily turning on the second switch.

10. The method of claim 6 wherein the step of activating said timing circuit compensates for temperature, process and supply voltage variations, wherein the buffer circuit delay remains substantially constant over such variations.

* * * * *